United States Patent
Nawashiro et al.

(10) Patent No.: US 7,078,738 B2
(45) Date of Patent: Jul. 18, 2006

(54) LIGHT-EMITTING DEVICE

(75) Inventors: Mitsuhiro Nawashiro, Aichi (JP); Satoshi Inagaki, Aichi (JP); Yasumasa Tatewaki, Aichi (JP); Takahide Oshio, Aichi (JP); Hisao Yamaguchi, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/775,324

(22) Filed: Feb. 11, 2004

(65) Prior Publication Data

US 2004/0188719 A1  Sep. 30, 2004

(30) Foreign Application Priority Data

Feb. 12, 2003  (JP)  ............................. P2003-033305
Sep. 25, 2003  (JP)  ............................. P2003-333012

(51) Int. Cl.
   *H01L 31/109*  (2006.01)
(52) U.S. Cl. ............................ 257/99; 257/200; 257/98; 257/97; 257/13; 257/88; 257/89; 257/91
(58) Field of Classification Search ................ 257/78, 257/29, 13, 88, 89, 99, 91, 98, 100, 96, 97
   See application file for complete search history.

(56) References Cited

U.S. PATENT DOCUMENTS

| 6,476,410 B1 * | 11/2002 | Ishinaga ........................ 257/13 |
| 6,661,032 B1 * | 12/2003 | Meng et al. .................... 257/99 |
| 2003/0141509 A1 * | 7/2003 | Udagawa ....................... 257/79 |

FOREIGN PATENT DOCUMENTS

| JP | 62-62568 | * | 3/1987 |
| JP | 10-303464 | | 11/1998 |
| JP | 2002-314143 | | 10/2002 |

* cited by examiner

*Primary Examiner*—Nathan J. Flynn
*Assistant Examiner*—Fazli Erdem
(74) *Attorney, Agent, or Firm*—McGinn IP Law Group, PLLC

(57) ABSTRACT

A light-emitting device has two light-emitting element. In a substrate portion of the light-emitting device having a first internal positive electrode connected to the positive electrode side of a first light-emitting element, a first internal negative electrode connected to the negative electrode side of the first light-emitting element, a second internal positive electrode connected to the positive electrode side of a second light-emitting element, and a second internal negative electrode connected to the negative electrode side of the second light-emitting element, these electrodes are provided so that homopolar electrodes are disposed diagonally.

15 Claims, 5 Drawing Sheets

LIGHT-EMITTING DEVICE

The present application is based on Japanese Patent Applications No. 2003-033305 and 2003-333012, which are incorporated herein by reference.

BACKGROUND OF THE INVENTION

1. Field of the Invention

The present invention relates to a light-emitting device. More specifically, it relates to an improvement in a light-emitting device of the type in which first and second light-emitting elements are mounted on the same surface side of a substrate portion.

2. Description of the Related Art

In the related art, there has been proposed a light-emitting device in which two light-emitting elements are mounted on one substrate portion in order to ensure a sufficient quantity of light (see Patent Document 1, etc.). As shown in FIG. 1, in accordance with the light-emitting device 1, four internal electrodes 3a, 3b, 3c and 3d are provided on a top surface of a rectangular substrate portion 2 so that light-emitting elements 5 and 6 are mounted on the two internal electrodes 3c and 3d disposed in parallel with each other. The internal electrodes 3a, 3b, 3c and 3d are connected to external electrodes 8a, 8b, 8c and 8d at corners of the substrate portion through leads 7a, 7b, 7c and 7d respectively. The external electrodes 8a, 8b, 8c and 8d are connected to pattern electrode portions 9a, 9b, 9c and 9d as partners in mounting, respectively.

As for techniques in connection with the invention, refer to Patent Document 2, please.

[Patent Document 1] U.S. Pat. No. 6,476,410
[Patent Document 2] JP-A-10-303464

In the light-emitting device 1 in which light-emitting elements are mounted on one substrate portion, the direction of electrical connection of each light-emitting element is fixed. Accordingly, the mounting direction of the light-emitting device 1 relative to the pattern electrode portions 9a, 9b, 9c and 9d is definite. If the connecting direction is reversed, a reverse current flows in each light-emitting element, thereby causing damage of the light-emitting element. Since the substrate portion 2 is shaped symmetrically, there is however possibility that the light-emitting device may be mounted particularly in a wrong lateral direction (rotated by 180° with respective to a correct direction). As a result, the direction of electrical connection of each light-emitting element is reversed to thereby cause damage to the light-emitting device. This brings a poor yield of light-emitting devices.

SUMMARY OF THE INVENTION

The invention has been made to solve the problem. The configuration of the invention is as follows. That is, a light-emitting device includes: a substrate portion having at least one mount surface; first and second light-emitting elements mounted on the same mount surface side; and four internal electrodes revealed on the mount surface of said substrate portion, the four internal electrodes including a first internal positive electrode connected to the positive electrode side of the first light-emitting element, a first internal negative electrode connected to the negative electrode side of the first light-emitting element, a second internal positive electrode connected to the positive electrode side of the second light-emitting element, and a second internal negative electrode connected to the negative electrode side of the second light-emitting element, the four internal electrodes being provided so that the first and second internal positive electrodes are disposed diagonally while the first and second internal negative electrodes are disposed diagonally.

According to the light-emitting device configured as described above, the four internal electrodes are provided so that homopolar electrodes are disposed diagonally. Accordingly, the electrically connecting direction of each light-emitting element is never reversed even if the light-emitting device is mounted in the condition that the substrate portion is turned by 180°. In other words, because polarities of internal electrodes constituting an internal electrode portion are disposed to be symmetrical about a predetermined point (e.g. central point) of the substrate portion, the polarity arrangement of the respective internal electrodes of the internal electrode portion after rotation of the substrate portion by 180° around the predetermined point is the same as that before rotation of the substrate portion. Accordingly, a reverse current can be surely prevented from flowing in each light-emitting element. That is, because it is unnecessary to pay special attention to the direction of arrangement of each light-emitting element when the light-emitting device is mounted, it is easy to mount the light-emitting device. Since a rated (forward) current is always applied to each light-emitting element, the yield of light-emitting device mounting structures is improved.

DETAILED DESCRIPTION OF THE PREFERRED EMBODIMENTS

Respective constituent parts of the invention will be described below.

(Light-Emitting Element)

Figure 1:
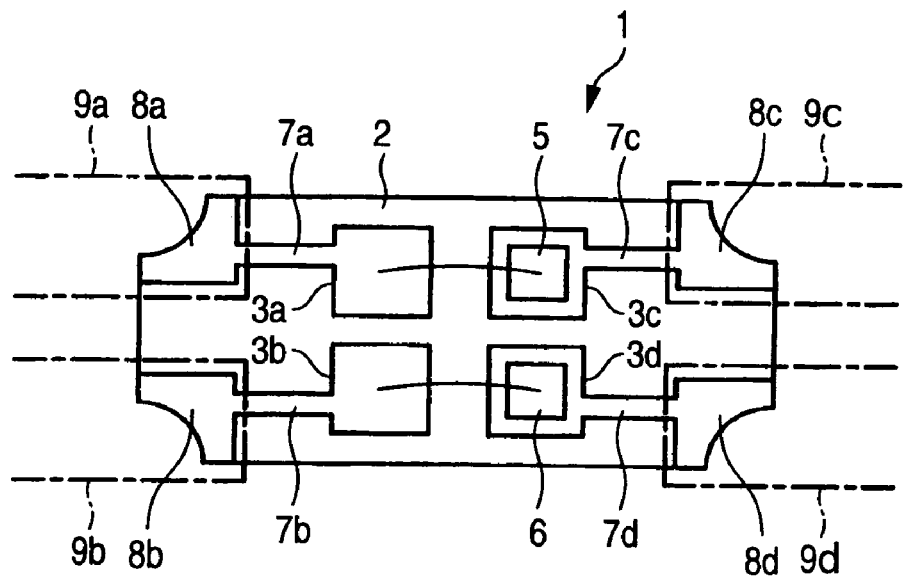
FIG. 1 is a plan view showing a configuration of a light-emitting device according to the related art.

A well known element such as a light-emitting diode or a laser diode may be used as each light-emitting element. It is preferable that first and second light-emitting elements are the same in terms of polarity in lamination of semiconductor layers. When, for example, the first light-emitting element has an n-type layer formed on its substrate side, it is preferable that the second light-emitting element also has an n-type layer formed on its substrate side. In this case, since the substrate side of each of the light-emitting elements is used as the negative electrode side, the substrate of each of the light-emitting elements is mounted on either of the first and second internal negative electrodes in the condition that the substrate is electrically conductive. Since the first and second internal negative electrodes are disposed diagonally, the arrangement of the light-emitting elements as light sources in the light-emitting device is well-balanced compared with the case where the light-emitting elements are arranged one-sidedly as shown in FIG. 1.

(Substrate Portion)

The substrate portion is made of an electrically insulating synthetic resin or inorganic material. The light-emitting elements are mounted on a top surface of the substrate portion. Although the shape of the substrate portion can be designed optionally, the substrate portion may be preferably shaped like a rectangle so that an existing manufacturing apparatus can be used.

(Internal Electrode Portion)

Four internal electrodes are revealed on a light-emitting element mount surface of the substrate portion. That is, the four internal electrodes are a first internal positive electrode connected to the positive electrode side of the first light-emitting element, a first internal negative electrode connected to the negative electrode side of the first light-emitting element, a second internal positive electrode connected to the positive electrode side of the second light-emitting element, and a second internal negative electrode connected to the negative electrode side of the second light-emitting element. In the invention, homopolar electrodes are disposed diagonally. That is, the first and second internal positive electrodes are disposed diagonally while the first and second internal negative electrodes are disposed diagonally.

Substrates of the respective light-emitting elements are mounted on homopolar internal electrodes respectively. Upper electrodes of the light-emitting elements are connected to the other homopolar internal electrodes by wires respectively. When the light-emitting elements such as flip chip type light-emitting elements need to be mounted on the substrate portion through sub-mounts, the sub-mounts are mounted on homopolar internal electrodes and further connected to the other homopolar internal electrodes through wires respectively.

Preferably, the internal electrodes on which the light-emitting elements are mounted respectively have areas larger than those of the other internal electrodes (wire-bonded electrodes). This is for the following purpose. When the areas of the internal electrodes on which the light-emitting elements are mounted respectively are made large, efficiency in heat radiation from the internal electrodes is improved. Accordingly, heat is efficiently released from the light-emitting elements mounted on the internal electrodes, so that overheating of the light-emitting elements can be prevented. In addition, since the internal electrodes are made of metal, high reflectance can be obtained. Accordingly, when the areas of the internal electrodes on which the light-emitting elements are mounted respectively are made large, reflectance of each light-emitting element is improved.

When each internal electrode has a corner facing on any other internal electrode, the corner is preferably chamfered (beveled). This is because the electrode is apt to be peeled off from the corner if the corner is right-angled or acute-angled. Accordingly, when the corner is chamfered, the mechanical stability of the internal electrode is improved.

(External Electrode Portion)

While the internal electrode portion is connected to the light-emitting elements, an external electrode portion is connected to a pattern electrode portion that is a partner when the light-emitting device is mounted. Four external electrodes are provided in the substrate portion so as to correspond to the four internal electrodes. Although positions and shapes of the external electrodes formed can be designed suitably in accordance with the structure of the pattern electrode portion, the external electrode portion is provided so that homopolar external electrodes are disposed diagonally because the internal electrode portion is provided so that homopolar internal electrodes are disposed diagonally. That is, a first external positive electrode connected to the first internal positive electrode and a second external positive electrode connected to the second internal positive electrode are disposed diagonally while a first external negative electrode connected to the first internal negative electrode and a second external negative electrode connected to the second internal negative electrode are disposed diagonally. The configuration of arrangement of the external electrode portion is essential for avoiding crossing (short-circuiting) of leads by which the internal electrodes are connected to the external electrodes.

Incidentally, when the substrate portion is formed as a multi-layer structure to prevent crossing of the leads, the external electrodes may be disposed desirably. For example, the external electrodes can be provided so that homopolar external electrodes are disposed in parallel with each other.

(Pattern Electrode Portion)

The pattern electrode portion is a partner with the light-emitting device when the light-emitting device is mounted. The light-emitting device may be provided in two situations. One situation is that the two light-emitting elements in the light-emitting device are preferably series-controlled. The other situation is that the two light-emitting elements in the light-emitting device are preferably parallel-controlled. When, for example, the light-emitting device is used in a vehicle, it is preferable that the light-emitting elements are disposed in series for utilizing a voltage drop in each light-emitting element because the voltage of a power supply of the vehicle is relatively high.

Pattern electrodes are designed in accordance with the power supply form to the light-emitting elements. In order to supply electric power to the light-emitting elements of the light-emitting device in parallel, a first pattern electrode portion facing on the external electrodes disposed diagonally in the external electrode portion of the light-emitting device and a second pattern electrode portion facing on the other external electrodes in the external electrode portion are formed as a parallel pattern electrode portion. On the other hand, in order to supply electric power to the light-emitting elements of the light-emitting device in series, a third pattern electrode portion facing on the external electrodes disposed in parallel in the external electrode portion of the light-emitting device and a fourth pattern electrode portion facing on the other external electrodes in the external electrode portion are formed as a series pattern electrode portion.

EMBODIMENT

Hereinafter, preferred embodiments of the present invention will be described in detail.

Figure 2:
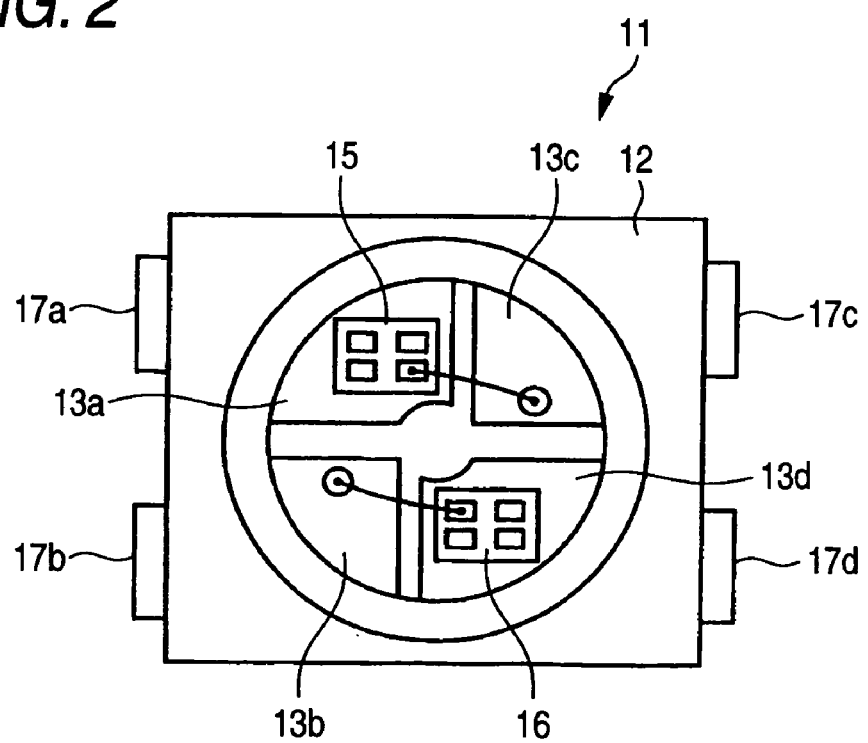
FIG. 2 is a plan view showing a configuration of a light-emitting device according to an embodiment of the invention.
Figure 3:
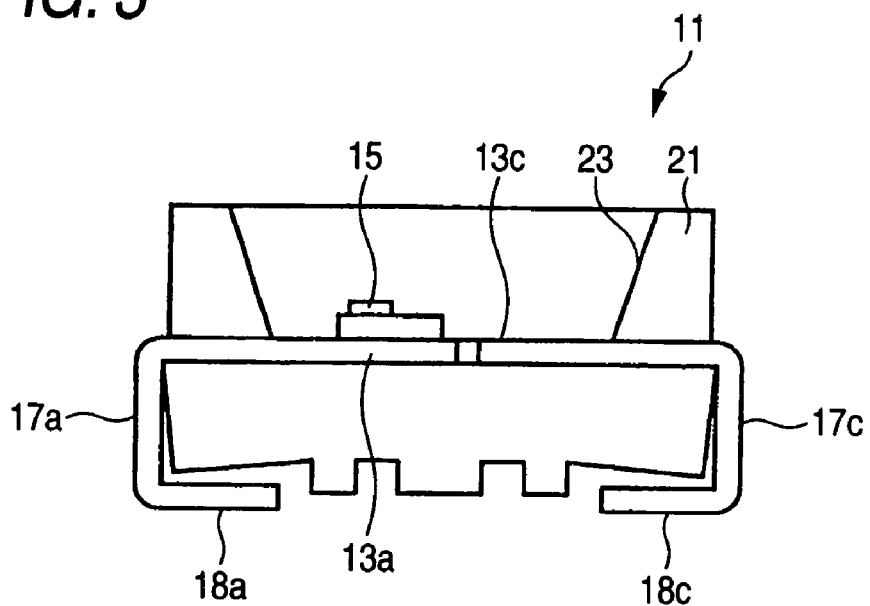
FIG. 3 is a sectional view of the light-emitting device depicted in FIG. 2.
Figure 4:
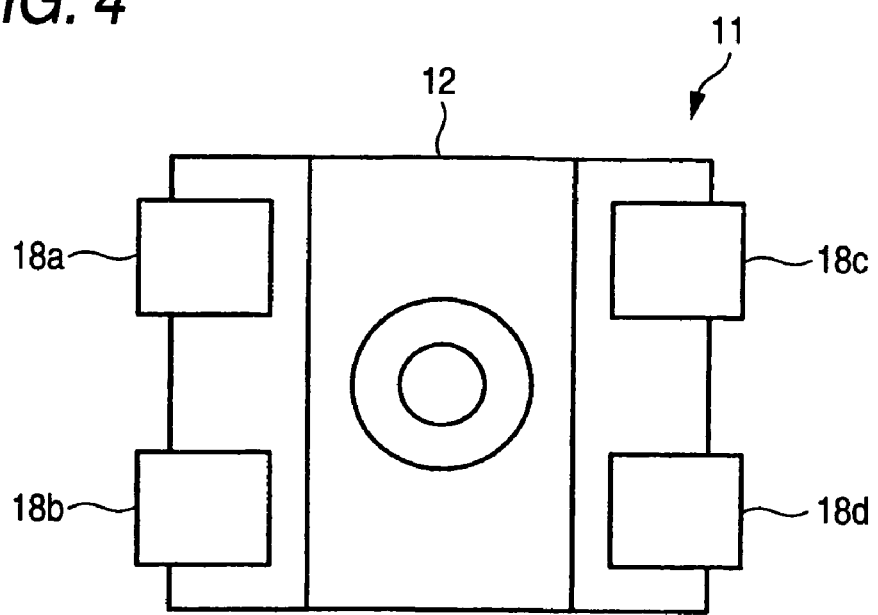
FIG. 4 is a bottom view of the light-emitting device depicted in FIG. 2.

FIG. 2 is a plan view of a light-emitting device 11 according to an embodiment of the invention, FIG. 3 is a sectional view of the light-emitting device 11, and FIG. 4 is a bottom view of the light-emitting device 11. The light-emitting device 11 has a substrate portion 12 shaped like a rectangle in plan view. A cylindrical cover portion 21 is formed on an upper surface of the substrate portion 12. An inner circumferential surface 23 of the cover portion 21 is formed as a reflecting surface. Engaging irregularities are formed in a rear surface of the substrate portion 12.

Internal electrodes 13a, 13b, 13c, and 13d constituting an internal electrode portion are revealed in the cover portion 21. A substrate of a light-emitting element 15 is mounted on the internal electrode 13a. A surface electrode of the light-emitting element 15 is connected to the internal electrode 13c through a lead. The light-emitting element 15 is of the type emitting red light. The light-emitting element 15 has a negative electrode (n-electrode) on the substrate side, and a positive electrode (p-electrode) on the surface electrode side. Accordingly, the internal electrode 13a is equivalent to a first internal negative electrode whereas the internal electrode 13c is equivalent to a first internal positive electrode. A substrate of a light-emitting element 16 is mounted on the internal electrode 13d. A surface electrode of the light-emitting element 16 is connected to the internal electrode 13b through a lead. The light-emitting element 16 is of the type emitting red light as standardized in the same manner as in the light-emitting element 15. The light-emitting element 16 has a negative electrode (n-electrode) on the substrate side, and a positive electrode (p-electrode) on the surface electrode side. Accordingly, the internal electrode 13d is equivalent to a second internal negative electrode whereas the internal electrode 13b is equivalent to a second internal positive electrode.

The internal electrodes 13a, 13b, 13c, and 13d are connected to external electrodes 18a, 18b, 18c and 18d through leads 17a, 17b, 17c and 17d respectively. As shown in FIG. 2, the leads 17a and 17b are turned from a left edge of the substrate portion 12 to the rear surface of the substrate portion 12 so as to be connected to the external electrodes 18a and 18b respectively. The leads 17c and 17d are turned from a right edge of the substrate portion 12 to the rear surface of the substrate portion 12 so as to be connected to the external electrodes 18c and 18d respectively.

The substrate portion 12 is molded out of an electrically insulating synthetic resin. Each electrode portion is made of an electrically conductive metal by means of bending.

Figure 5:
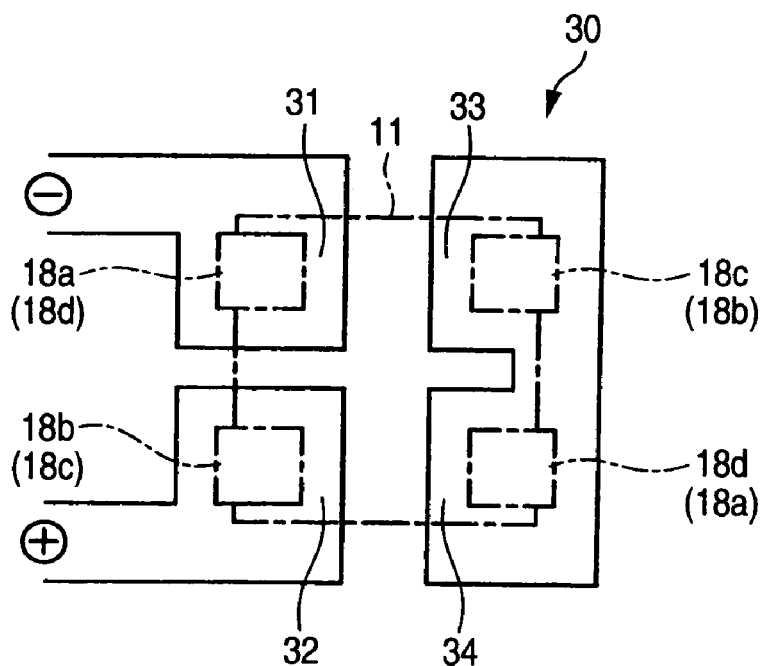
FIG. 5 is a plan view showing a series pattern electrode portion in the embodiment of the invention, in which the chain line shows the light-emitting device mounted on the series pattern electrode portion.

FIG. 5 shows a pattern electrode portion 30. In FIG. 5, the chain line shows the light-emitting device 11 mounted on the pattern electrode portion 30. The pattern electrode portion shown in FIG. 5 is a series pattern electrode portion through which a current is applied to the light-emitting elements 15 and 16 of the light-emitting device 11 in series. The pattern electrode portion 30 includes four pads 31, 32, 33 and 34 which are connected to the external electrodes 18a, 18b, 18c and 18d of the light-emitting device, respectively. The pads 33 and 34 correspond to a first external positive electrode and a second external negative electrode respectively to thereby form a third pattern electrode portion. The first external positive electrode and the second external negative electrode are disposed in an external electrode portion of the light-emitting device so as to be parallel with each other. Similarly, the pads 31 and 32 correspond to a first external negative electrode and a second external positive electrode respectively to thereby form a fourth pattern electrode portion. The first external negative electrode and the second external positive electrode are disposed in the external electrode portion of the light-emitting device so as to be parallel with each other.

When the light-emitting device 11 is mounted on the pattern electrode portion 30 as shown in FIG. 5, a current flows in the following manner. That is, a current flows from the pad 32 into the external positive electrode 18b, the lead 17b, the internal positive electrode 13b, the second light-emitting element 16, the internal negative electrode 13d, the lead 17d, the external negative electrode 18d, the pad 34, the pad 33, the external positive electrode 18c, the lead 17c, the internal positive electrode 13c, the first light-emitting element 15, the internal negative electrode 13a, the lead 17a, the external negative electrode 18a and the pad 31, successively. Accordingly, the light-emitting elements 15 and 16 have relation of series connection.

When the light-emitting device 11 in this condition is rotated by 180°, a current flows in the flowing manner. Incidentally, in FIG. 5, reference numerals for designating corresponding external electrodes are put in parentheses. That is, a current flows from the pad 32 into the external positive electrode 18c, the lead 17c, the internal positive electrode 13c, the first light-emitting element 15, the internal negative electrode 13a, the lead 17a, the external negative electrode 18a, the pad 34, the pad 33, the external positive electrode 18b, the lead 17b, the internal positive electrode 13b, the second light-emitting element 16, the internal negative electrode 13d, the lead 17d, the external negative electrode 18d and the pad 31, successively. Also in this case, the relation of series connection between the light-emitting elements 15 and 16 can be retained.

Figure 6:
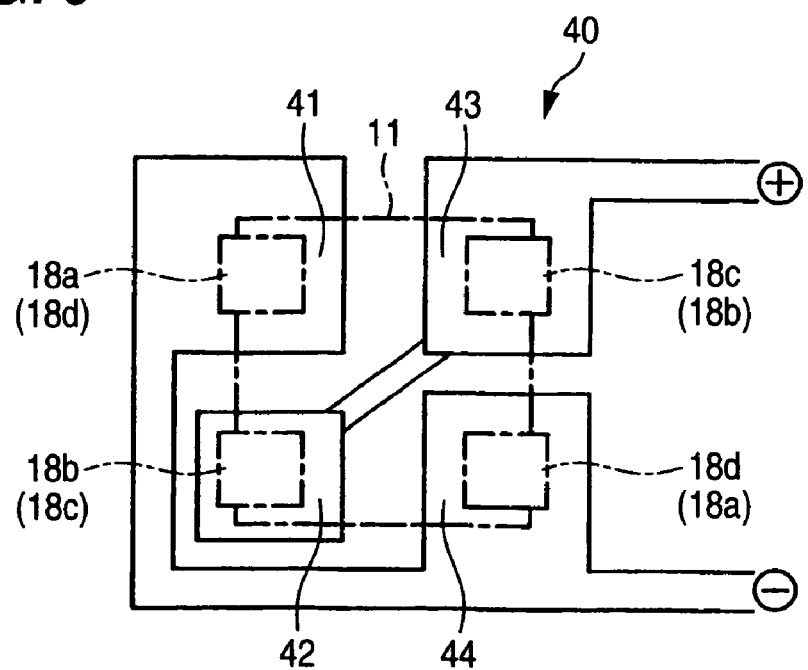
FIG. 6 is a plan view showing a parallel pattern electrode portion in the embodiment of the invention, in which the chain line shows the light-emitting device mounted on the parallel pattern electrode portion.

FIG. 6 shows a pattern electrode portion 40. In FIG. 6, the chain line shows the light-emitting device 11 mounted on the pattern electrode portion 40. The pattern electrode portion shown in FIG. 6 is a parallel pattern electrode portion through which currents are applied to the light-emitting elements 15 and 16 of the light-emitting device 11 in parallel. The pattern electrode portion 40 includes four pads 41, 42, 43 and 44 which are connected to the external electrodes 18a, 18b, 18c and 18d of the light-emitting device, respectively. The pads 41 and 44 correspond to the first external negative electrode and the second external negative electrode respectively to thereby form a first pattern electrode portion. The first external negative electrode and the second external negative electrode are arranged diagonally in the external electrode portion of the light-emitting device. Similarly, the pads 42 and 43 correspond to the second external positive electrode and the first external positive electrode respectively to thereby form a second pattern electrode portion. The second external positive electrode and the first external positive electrode are arranged diagonally in the external electrode portion of the light-emitting device.

When the light-emitting device 11 is mounted on the pattern electrode portion 40 as shown in FIG. 6, currents flow in parallel in the following manner. That is, a first current flows from the pad 43 into the external positive electrode 18c, the lead 17c, the internal positive electrode 13c, the first light-emitting element 15, the internal negative electrode 13a, the lead 17a, the external negative electrode 18a and the pad 41, successively. A second current flows from the pad 43 into the pad 42, the external positive electrode 18b, the lead 17b, the internal positive electrode 13b, the second light-emitting element 16, the internal negative electrode 13d, the lead 17d, the external negative electrode 18d and the pad 44, successively.

When the light-emitting device in this condition is rotated by 180°, currents flow in the following manner. Incidentally, in FIG. 6, reference numerals for designating corresponding external electrodes are put in parentheses. That is, a first current flows from the pad 43 into the external positive electrode 18b, the lead 17b, the internal positive electrode 13b, the second light-emitting element 16, the internal negative electrode 13d, the lead 17d, the external negative electrode 18d and the pad 41, successively. A second current flows from the pad 43 into the pad 42, the external positive electrode 18c, the lead 17c, the internal positive electrode 13c, the first light-emitting element 15, the internal negative electrode 13a, the lead 17a, the external negative electrode 18a and the pad 44, successively. Also in this case, the relation of parallel connection between the light-emitting elements 15 and 16 is retained.

As described above, in the mounting structure of the light-emitting device according to this embodiment, rated currents can be applied to the light-emitting elements respectively even in the case where the light-emitting device 11 is mounted in the condition that it is rotated by 180°. That is, application of reverse currents to the light-emitting elements as in the related art can be surely prevented from causing damage of the light-emitting elements.

In the light-emitting device 11 according to this embodiment, the pattern electrodes may be designed as shown in FIG. 5 or 6 so that the light-emitting elements in the light-emitting device 11 can be connected in series or in parallel.

That is, the first pattern electrode portion facing on the external electrodes disposed diagonally in the external electrode portion of the light-emitting device and the second pattern electrode portion facing on the other external electrodes in the external electrode portion may be provided to form the parallel pattern electrode portion. The third pattern electrode portion facing on the external electrodes disposed in parallel in the external electrode portion of the light-emitting device and the fourth pattern electrode portion facing on the other external electrodes in the external electrode portion may be provided to form the series pattern electrode portion.

Figure 7:
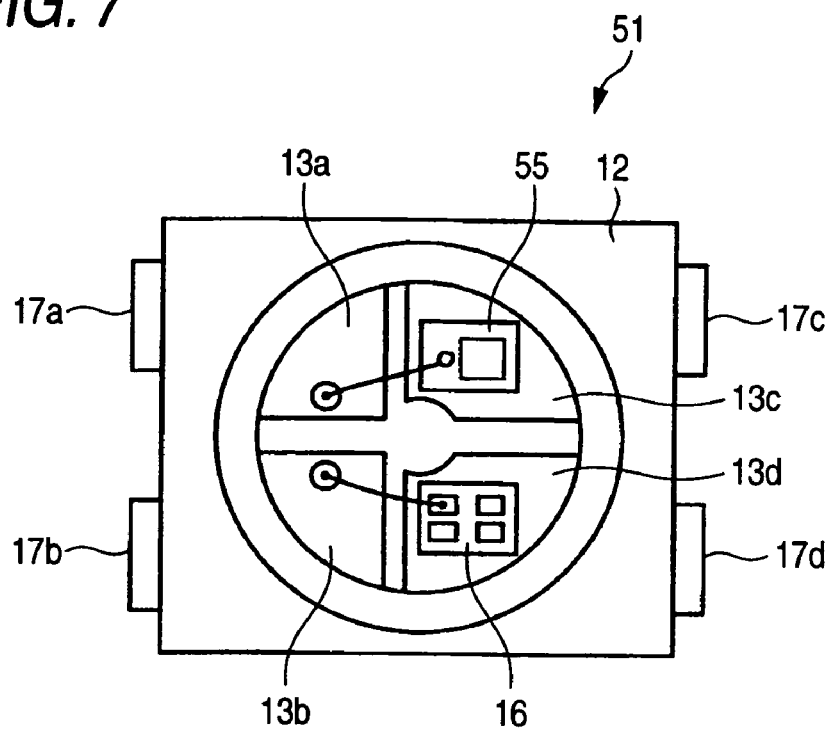
FIG. 7 is a plan view showing a configuration of a light-emitting device according to another embodiment of the invention.

FIG. 7 shows a plan view of a light-emitting device 51 according to another embodiment of the invention. The same parts as those in FIG. 2 are referred to by the same numerals as those in FIG. 2 for the sake of omission of duplicated description.

In the light-emitting device 51, a first light-emitting element 55 is provided so that polarity on the substrate side is positive and polarity on the surface electrode side is negative. Accordingly, the first light-emitting element 55 and the second light-emitting element 16 are arranged on one side of the substrate portion 2. The mounting form shown in FIG. 7 is effective when light-emitting elements different in kind are used.

The configuration of electrodes in the light-emitting device 51 is the same as shown in FIG. 2. The first light-emitting element 55 is a flip chip type light-emitting element. And the second light-emitting element 16 is a face up type light-emitting element which is electrically connected by metallic wire. Accordingly, application of reverse currents to the light-emitting elements of the light-emitting device can be surely prevented regardless of whether the partner in mounting is the parallel pattern electrode portion or the series pattern electrode portion.

Figure 8:
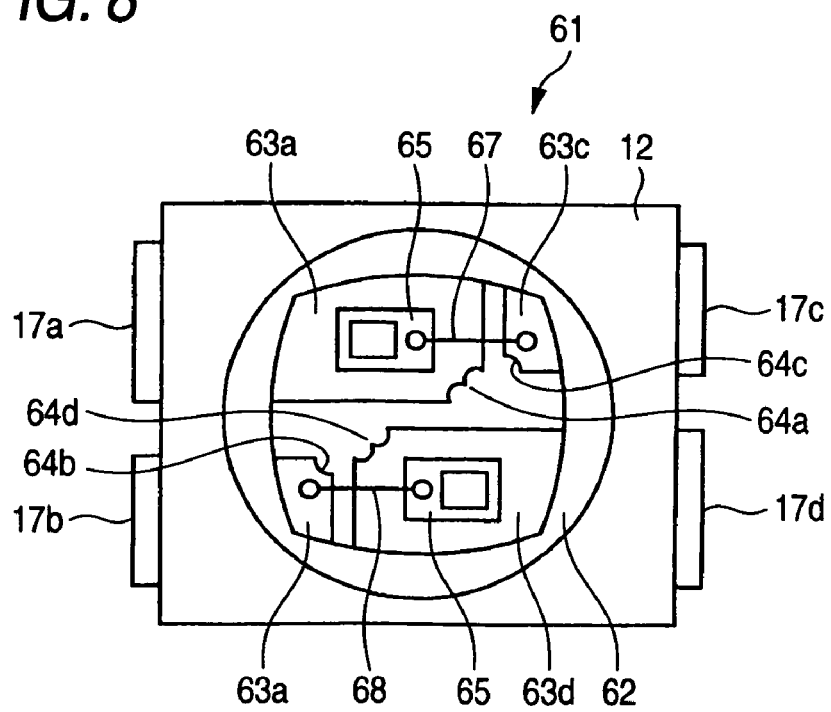
FIG. 8 is a plan view showing a configuration of a light-emitting device according to a further embodiment of the invention.

FIG. 8 shows a plan view of a light-emitting device 61 according to a further embodiment of the invention. The same parts as those in FIG. 2 are referred to by the same numerals as those in FIG. 2 for the sake of omission of duplicated description.

In the light-emitting device 61 according to this embodiment, internal electrodes 63a and 63d on which light-emitting elements 65 are mounted respectively are formed so that the area of each internal electrode is as large as possible. Accordingly, heat can be efficiently released from each light-emitting element 65 to the outside, so that a high-output light-emitting element can be used as the light-emitting element 65. Light emitted from each light-emitting element 65 toward the substrate portion (in a direction reverse to the optical axis) can be captured and reflected by an electrode surface having a larger area. Accordingly, efficiency in extracting the light to the outside is improved.

Since the area of each of the internal electrodes 63a and 63d on which the light-emitting elements 65 are mounted respectively is made large, the area of each of the other internal electrode 63b and 63c becomes small. It will go well as long as the internal electrodes 63b and 63c have areas sufficient to bond wires 67 and 68. Because heat transmitted from the light-emitting elements through the wires 67 and 68 is limited, the heat can be more efficiently released from the light-emitting elements to the outside when the area of each of the internal electrodes 63b and 63c for wire-bonding is made relatively small while the area of each of the other internal electrodes 63a and 63d on which the light-emitting elements are directly mounted respectively is made relatively large.

Incidentally, the area of each of the internal electrodes on which the light-emitting elements are mounted respectively is preferably selected to be not smaller than twice as large as the area of each of the other internal electrodes and more preferably in a range of from four times to five times as large as the area of each of the other internal electrodes.

In FIG. 8, the reference numeral 62 designates a cover portion having an inner circumferential surface formed as a reflecting surface.

The operation of the light-emitting device 61 is the same as that of the light-emitting device 11 shown in FIG. 2.

In this embodiment, corners 64a, 64b, 64c and 64d of the internal electrodes 63a, 63b, 63c and 63d are chamfered. Accordingly, the corners 64a, 64b, 64c and 64d in the internal electrodes 63a, 63b, 63c and 63d can be prevented from being peeled off from the substrate portion 12. Although this embodiment has been described on the case where the corners of the internal electrodes are cut semicircularly to be chamfered, the invention may be also applied to the case where the corners are provided as curved surfaces with radius R.

Figure 9:
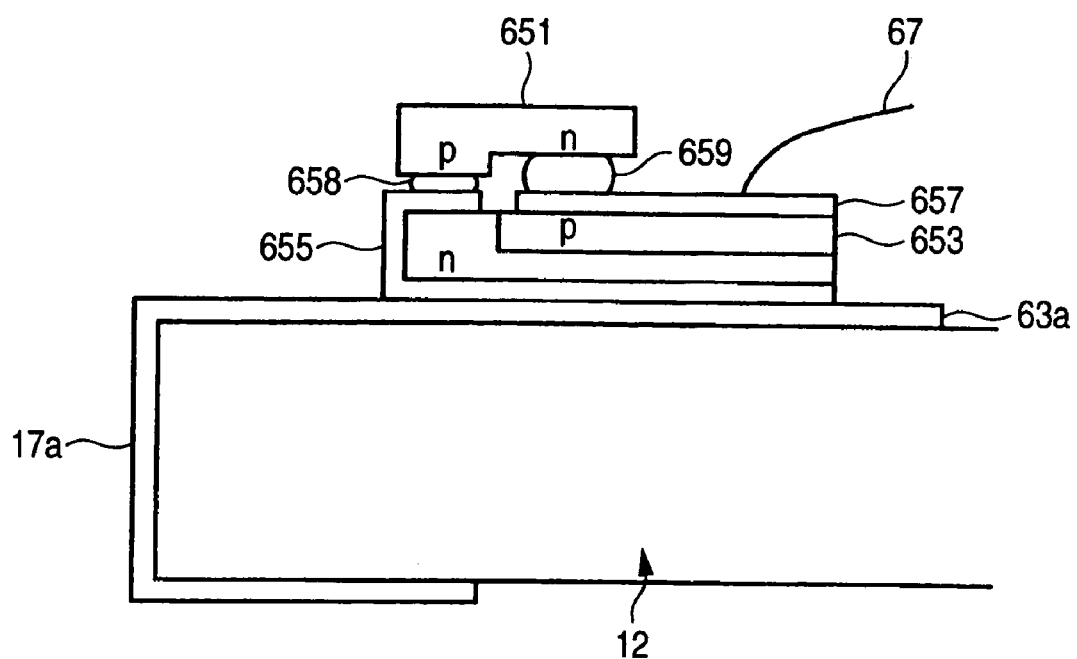
FIG. 9 is a sectional view showing a mounting structure of a flip chip type light-emitting element.

In this embodiment, a flip chip type light-emitting element shown in FIG. 9 is used as each light-emitting element 65. As shown in FIG. 9, p- and n-electrodes of a light-emitting diode 651 are bonded to p- and n-electrodes 655 and 657 of a sub-mount 653 by bumps 658 and 659 respectively. The sub-mount 653 has a Zener diode structure to prevent a reverse current from flowing in the light-emitting diode 651.

The invention is not limited to the description of the mode for carrying out the invention and the embodiments thereof at all. Various modifications that can be easily conceived by those skilled in the art may be included in the invention without departing from the scope of Claim.

What is claimed is:

1. A light-emitting device comprising:
   a substrate portion having at least one mount surface;
   a first light-emitting element and a second light-emitting element mounted on a same mount surface side; and
   four internal electrodes revealed on the at least one mount surface of said substrate portion, said four internal electrodes comprising:
      a first internal positive electrode connected to a positive electrode side of said first light-emitting element;
      a first internal negative electrode connected to a negative electrode side of said first light-emitting element;
      a second internal positive electrode connected to a positive electrode side of said second light-emitting element; and
      a second internal negative electrode connected to a negative electrode side of said second light-emitting element,
   wherein said four internal electrodes are provided such that said first internal positive electrode and said second internal positive electrode are disposed diagonally while the first internal negative electrode and the second internal negative electrode are disposed diagonally,
   wherein said first light-emitting element is mounted on either of said first internal positive electrode and said first internal negative electrode,
   wherein said second light-emitting element is mounted on either of said second internal positive electrode and said second internal negative electrode, and
   wherein said internal electrodes on which said first light-emitting element and said second light-emitting element are mounted respectively comprise areas larger than those of other internal electrodes.

2. A light-emitting device according to claim 1, wherein said first light-emitting element and said second light-emitting element are disposed diagonally.

3. A light-emitting device according to claim 1, wherein said first light-emitting element is mounted on either of said first internal positive electrode and said first internal negative electrode,
   wherein said second light-emitting element is mounted on either of said second internal positive electrode and said second internal negative electrode, and
   wherein said first light emitting element and said second light-emitting element are disposed in parallel.

4. The light-emitting device according to claim 1, wherein said four internal electrodes are disposed such that a polarity of said four internal electrodes is symmetrical about a predetermined point.

5. The light-emitting device according to claim 1, wherein said first light-emitting element and said second light-emitting element comprise a same polarity in lamination of semiconductor layers.

6. The light-emitting device according to claim 1, wherein a substrate of said first light-emitting element and a substrate of said second light-emitting element are mounted on homopolar internal electrodes.

7. The light-emitting device according to claim 6, wherein an upper electrode of said first light-emitting element and an upper electrode of said second light-emitting element are connected to homopolar internal electrodes other than the homopolar internal electrodes which said substrate of said first light-emitting element and said substrate of said second light-emitting element are mounted.

8. The light-emitting device according to claim 1, wherein said four internal electrodes comprise metal electrodes.

9. The light-emitting device according to claim 1, wherein said four internal electrodes are connected to external electrodes through leads.

10. The light-emitting device according to claim 2, wherein said first light-emitting element comprises a same type of light-emitting element as said second light-emitting element.

11. The light-emitting device according to claim 3, wherein said first light-emitting element comprises a different type of light-emitting element as said second light-emitting element.

12. The light-emitting device according to claim 9, wherein said external electrodes are arranged such that homopolar external electrodes are disposed diagonally.

13. A light-emitting device mounting structure comprising a light-emitting device, and a pattern structure for mounting said light-emitting device, wherein said light-emitting device comprises:
   a substrate portion having at least one mount surface;
   a first light emitting element and a second light-emitting element mounted on a same mount surface side of said substrate portion;
   an internal electrode portion revealed on the mount surface of said substrate portion; and
   an external electrode portion revealed on a surface of said substrate portion other than said mount surface,
   wherein said internal electrode portion comprises:
      a first internal positive electrode connected to a positive electrode side of said first light-emitting element;
      a first internal negative electrode connected to a negative electrode side of said first light-emitting element;
      a second internal positive electrode connected to a positive electrode side of said second light-emitting element; and
      a second internal negative electrode connected to a negative electrode side of said second light-emitting element,
   wherein said internal electrode portion is provided such that said first internal positive electrode and said second internal positive electrode are disposed diagonally while the first internal negative electrode and the second internal negative electrode are disposed diagonally,
   wherein said external electrode portion comprises:
      a first external positive electrode connected to said first internal positive electrode;
      a first external negative electrode connected to said first internal negative electrode;
      a second external positive electrode connected to said second internal positive electrode; and
      a second external negative electrode connected to said second internal negative electrode,
   wherein said external electrode portion is provided such that said first external positive electrode and said second external positive electrode are disposed diagonally while the first external negative electrode and the second external negative electrode are disposed diagonally, and
   wherein said pattern structure comprises at least one of a parallel pattern electrode portion and a series pattern electrode portion,
   wherein said parallel pattern electrode portion comprises:
      a first pattern electrode portion facing on two diagonal electrodes of said external electrode portion of said light-emitting device; and a second pattern electrode portion facing on other two diagonal electrodes of said external electrode portion, wherein said series pattern electrode portion comprises:
a third pattern electrode portion facing on two parallel electrodes of said external electrode portion of said light-emitting device; and
a fourth pattern electrode portion facing on other two parallel electrodes of said external electrode portion.

14. A light-emitting device mounting structure according to claim 13, wherein said first light-emitting element is mounted on either of said first internal positive electrode and said first internal negative electrode, wherein said second light-emitting element is mounted on either of said second internal positive electrode and said second internal negative electrode, and wherein said first light-emitting element and said second light-emitting element are disposed diagonally.

15. A light-emitting device mounting structure according to claim 13, wherein said first light-emitting element is mounted on either of said first internal positive electrode and said first internal negative electrode, wherein said second light-emitting element is mounted on either of said second internal positive electrode and said second internal negative electrode, and wherein said first light emitting element and said second light-emitting element are disposed in parallel.

* * * * *